United States Patent
Kizilyalli et al.

(10) Patent No.: US 6,281,110 B1
(45) Date of Patent: Aug. 28, 2001

(54) METHOD FOR MAKING AN INTEGRATED CIRCUIT INCLUDING DEUTRIUM ANNEALING OF METAL INTERCONNECT LAYERS

(75) Inventors: Isik C. Kizilyalli; Sailesh Mansinh Merchant; Pradip Kumar Roy, all of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/361,733

(22) Filed: Jul. 27, 1999

(51) Int. Cl.[7] .................. H01L 21/4763; H01L 21/44
(52) U.S. Cl. ................. 438/622; 438/660; 438/687
(58) Field of Search ....................... 438/618, 622, 438/660, 687

(56) References Cited

U.S. PATENT DOCUMENTS

| 5,872,387 | 2/1999 | Lyding et al. | 257/607 |
| 6,023,093 | * 2/2000 | Gregor et al. | 257/632 |
| 6,071,808 | * 6/2000 | Merchant et al. | 438/633 |
| 6,077,791 | * 6/2000 | Detar | 438/778 |
| 6,143,634 | * 11/2000 | Wallace et al. | 438/585 |

OTHER PUBLICATIONS

Kizilyalli et al., Multi–Level Metal CMOS Manufacturing with Deuterium for Improved Hot Carrier Reliability, 1998, IEE, pp 935–938.*

Kizilyalli et al., Deuterium Post–Metal Annealing of MOSFET's for Improved Hot Carrier Reliability, Mar. 1997, IEEE Electron Device Letters, vol. 18, No. 3, pp 81–83.*

* cited by examiner

Primary Examiner—Richard Elms
Assistant Examiner—Adam Pyonin
(74) Attorney, Agent, or Firm—Allen, Dyer, Doppelt, Milbrath & Gilchrist, P.A.

(57) ABSTRACT

A method of making an integrated circuit includes forming a plurality of copper interconnect layers adjacent a semiconductor substrate. The plurality of copper interconnect layers are then annealed, in a deuterium ambient, prior to chemical mechanical polishing of such layers. The microstructure of each of the copper interconnect layers is thereby stabilized.

18 Claims, 3 Drawing Sheets

DEUTERIUM AMBIENT

CMP

METHOD FOR MAKING AN INTEGRATED CIRCUIT INCLUDING DEUTRIUM ANNEALING OF METAL INTERCONNECT LAYERS

FIELD OF THE INVENTION

The present invention relates to the field of semiconductors, and, in particular, to a method for making an integrated circuit including metal interconnect layers.

BACKGROUND OF THE INVENTION

A problem in the field of semiconductors is the degradation of device performance by hot carrier aging (HCA). This is a particular concern with respect to smaller devices in which proportionally larger voltages are used. When such high voltages are used, charge carriers can be sufficiently energetic to enter an insulating layer and degrade device behavior. Various approaches to addressing HCA are, however, expensive because they typically complicate the fabrication process.

After contact holes are patterned in a field oxide, a conductive metal layer is deposited (i.e. a metallization layer) to connect integrated circuit components. Metallization materials typically include aluminum and copper, for example. Copper is a better conductor than aluminum and because of reductions needed for 0.25 $\mu$m and sub 0.25 $\mu$m devices, copper is preferred as the metallization material. Additionally, copper is resistant to electromigration and can be deposited at low temperatures. A copper metallization layer may be formed by electrodeposition or electroplating. For a multi-metallization level device, after each step of electroplating copper, the device is annealed in a nitrogen gas atmosphere (forming gas) to stabilize the copper layer.

After the final metallization layer is formed, i.e. after the final copper electroplating step and the forming gas annealing step, a protective or passivation layer (cap) is formed on the device. Then, the device can be further annealed in a forming gas or deuterium gas atmosphere to reduce hot carrier aging. U.S. Pat. No. 5,872,387 to Lyding et al., for example, discloses a method for treating a semiconductor device which includes a step of passivating the device with deuterium. Thus, conventional techniques, e.g. as discussed above, necessitate relatively extended time annealing due to the numerous forming gas annealing steps during the electroplating of the copper metallization layers, in combination with the final annealing step after the device is substantially complete.

SUMMARY OF THE INVENTION

In view of the foregoing background, it is therefore an object of the invention to reduce the number of annealing steps and associated time needed to form an integrated circuit device having improved hot carrier aging and better operational characteristics.

It is a further object of the invention to reduce the number of annealing steps and associated time needed to form an integrated circuit device while providing microstructure stability of the metallization layers.

These and other objects, features and advantages in accordance with the present invention are provided by a method of making an integrated circuit including forming a plurality of copper interconnect layers adjacent a semiconductor substrate; and, annealing, in a deuterium ambient, each copper interconnect layer after formation thereof. The microstructure of the copper is thereby stabilized. The copper interconnect layers can be electrodeposited and the step of annealing each layer may be performed in a temperature range of about 400–450° C. Also, the deuterium ambient is preferably a deuterium enriched gas.

The method further preferably includes chemical-mechanical polishing (CMP) each copper interconnect layer after each copper interconnect layer is annealed. Inter-level dielectric layers are preferably formed between each of the plurality of copper interconnect layers and an overall passivation layer is formed over an uppermost copper interconnect layer. A last annealing step using deuterium is preferably performed prior to forming the overall passivation layer. In other words, an overall deuterium annealing is not required after the cap is formed.

Alternatively, the method may include forming a plurality of metal interconnect layers adjacent a semiconductor substrate, wherein at least one of the plurality of metal interconnect layers comprises copper. Then the at least one metal interconnect layer comprising copper is annealed in a deuterium ambient. In this embodiment, at least one of the plurality of metal interconnect layers may comprise another metal, such as aluminum, for example.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for clarity.

In one of the first steps for making an integrated circuit, active and passive parts are fabricated in and on the wafer surface. A series of metal interconnect layers are successively formed on the wafer with inter-level dielectric (ILD) layers formed between adjacent metal interconnect layers. A last step typically includes covering the completed chip surface with a protective layer.

Figure 1:
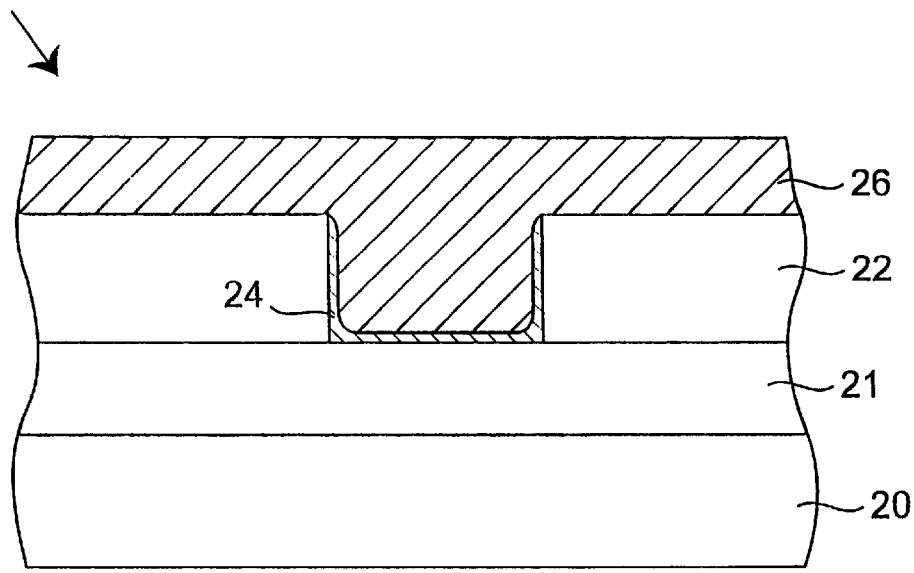
FIG. 1 is a schematic cross-sectional view of an integrated circuit illustrating the step of annealing in deuterium after forming a metal interconnect layer in accordance with the method of the present invention.
Figure 2:
FIG. 2 is a schematic cross-sectional view of an integrated circuit illustrating the step of chemical-mechanical polishing of the metal interconnect layer in accordance with the method of the present invention.
Figure 2:
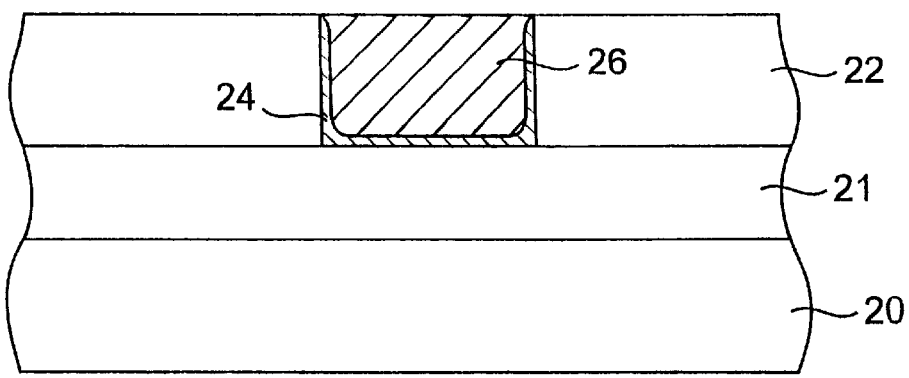

Referring to FIGS. 1–4, the method of making an integrated circuit 10 in accordance with the present invention is now described. The integrated circuit 10 as shown in the example of FIGS. 1 and 2, includes a substrate 20 having dielectric layers 21 and 22 formed thereon. Furthermore, a barrier layer 24 may be formed to line a recess in the dielectric layer 22 as will readily be understood by those skilled in the art. The illustrated embodiment of the method includes, after the start (Block 60), forming a first metal interconnect layer 26 (Block 62) adjacent a semiconductor substrate 20. This metal interconnect layer 26 preferably comprises copper, or alloys thereof, and is formed by electrodeposition of copper on the barrier layer 24. As would readily be appreciated by those skilled in the art, a copper seed layer may be deposited on the barrier layer 24 initially.

At Block 64, the first metal interconnect layer 26 is annealed in a deuterium ($D_2$) ambient to thereby stabilize the microstructure of the copper. Annealing in deuterium also improves hot carrier aging and transistor matching. The step of annealing may be performed in a temperature range of about 400–450° C. Also, the deuterium ambient is preferably a deuterium enriched gas.

Figure 3:
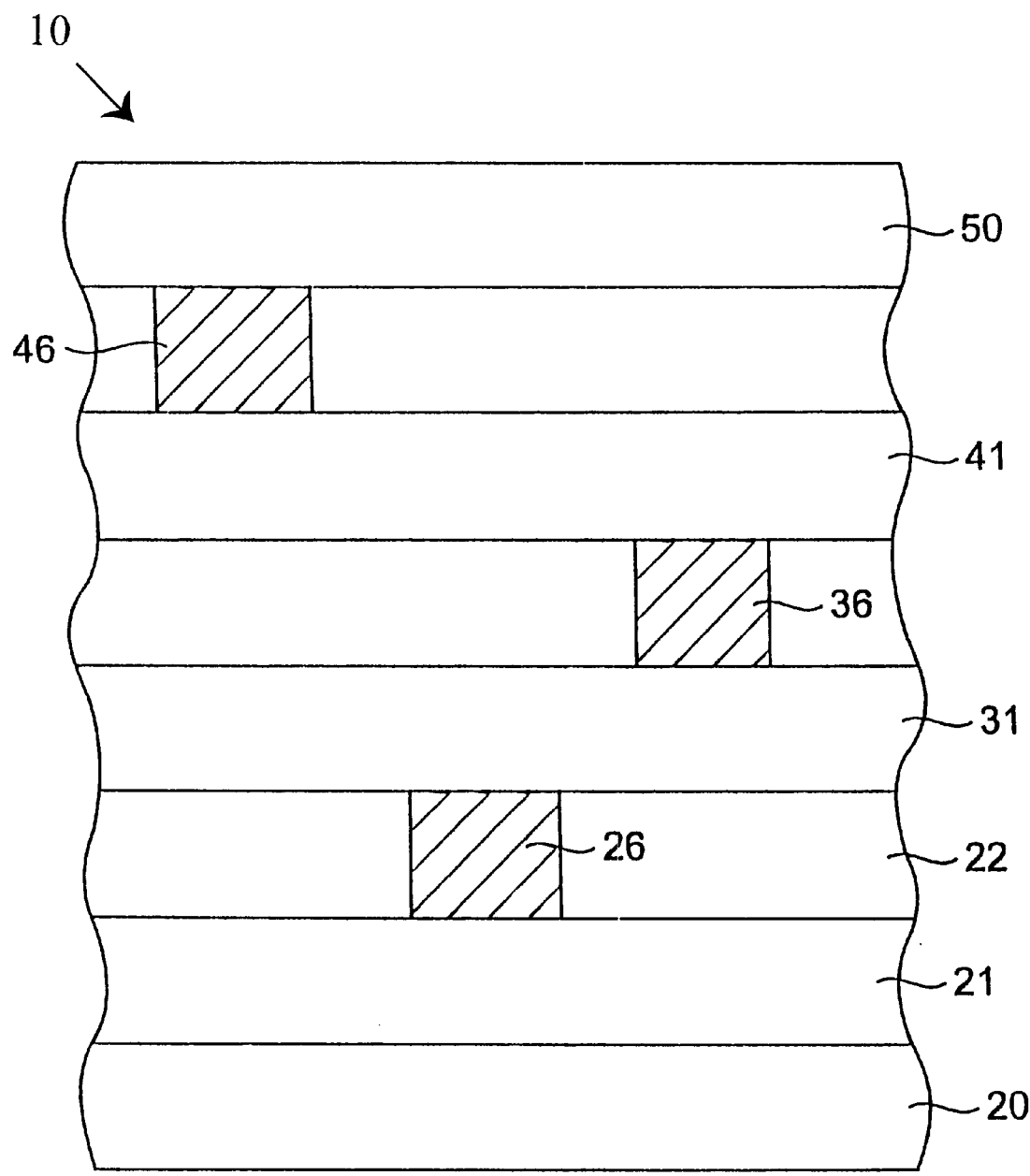
FIG. 3 is a schematic cross-sectional view of an integrated circuit with a plurality of metallization levels in accordance with the method of the present invention.
Figure 4:
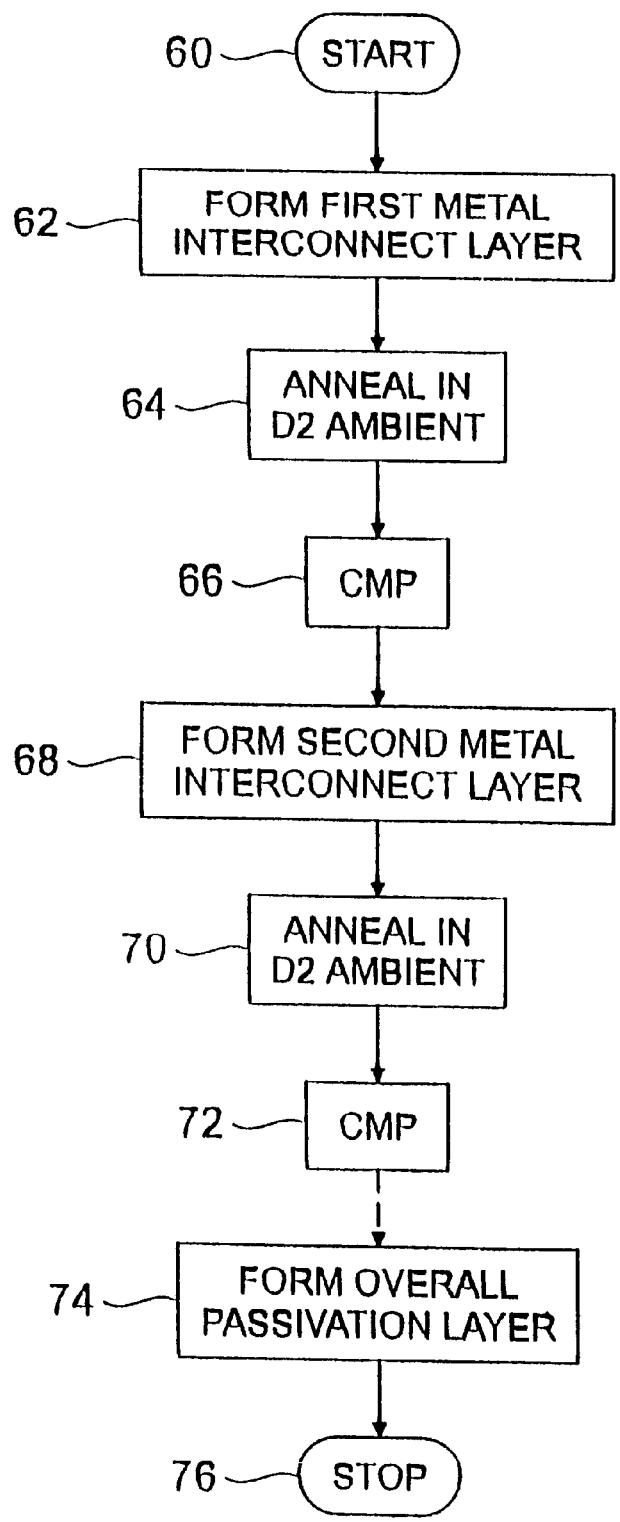
FIG. 4 is a flowchart for the method for making an integrated circuit in accordance with the present invention.

At block 66, and as illustrated in FIG. 2, the method further includes chemical-mechanical polishing (CMP) the first metal interconnect layer 26. The CMP step is also enhanced based upon the improvement in the microstructure of the copper achieved by the $D_2$ anneal. As shown in FIG. 3, an inter-level dielectric layer 31 is preferably formed on the first metal interconnect layer and dielectric layer 22. At Block 68, a second metal interconnect layer 36 is formed and subsequently annealed in $D_2$ (Block 70). Like the first metal interconnect layer 26, this second metal interconnect layer 36 is then polished (Block 72). In sum, a plurality of metal interconnect layers, e.g. 46, can be formed with further inter-level dielectric layers, e.g. 41, formed therebetween.

Lastly, at Block 74, an overall passivation layer 50 may be formed over an uppermost copper interconnect layer, e.g. over metal interconnect layer 46, before stopping (Block 76) as would readily be appreciated by those skilled in the art. It is noted that the last annealing step is performed prior to forming the overall passivation layer 50 thereby reducing the number of annealing steps, as well as reducing the time required for making the integrated circuit 10. Annealing, in forming gas or $D_2$, after the formation of the overall passivation layer 50 is not necessary because annealing in $D_2$ after the formation of each metal interconnect layer during fabrication already improves the integrated circuit characteristics and reduces hot carrier aging.

Alternatively, the method may include forming a plurality of metal interconnect layers 26, 36 and 46 adjacent a semiconductor substrate, wherein at least one of the plurality of metal interconnect layers, e.g. 26, comprises copper. Again, the copper interconnect layer 26 is preferably formed by electroplating copper on a barrier layer 24. Then the at least one metal interconnect layer 26 comprising copper is annealed in a deuterium ambient. In this embodiment, at least one of the plurality of metal interconnect layers, e.g. 36 or 46, may comprise another metal, such as aluminum, for example. The aluminum may be formed, for example, by conventional deposition techniques. The aluminum layer would not typically benefit from the $D_2$ anneal as does the copper interconnect layer.

Accordingly, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an integrated circuit comprising:
   providing a semiconductor substrate;
   forming a stack of copper interconnect layers adjacent the semiconductor substrate by electrodepositing copper;
   annealing, in a deuterium ambient, each copper interconnect layer after formation thereof to thereby stabilize the microstructure of the copper;
   chemical-mechanical polishing (CMP) each copper interconnect layer after the annealing.

2. A method according to claim 1 wherein annealing each copper interconnect layer comprises annealing in a temperature range of about 400–450° C.

3. A method according to claim 1 wherein the deuterium ambient comprises a gas including deuterium.

4. A method according to claim 1 further comprising forming an inter-level dielectric layer between each of the plurality of copper interconnect layers.

5. A method according to claim 1 wherein the stack of copper interconnect layers includes an uppermost copper interconnect layer; and further comprising forming an overall passivation layer over the uppermost copper interconnect layer.

6. A method according to claim 5 wherein the uppermost copper interconnect layer is annealed during a last annealing step which is performed prior to forming the overall passivation layer.

7. A method for making an integrated circuit comprising the steps of:
   providing a semiconductor substrate;
   forming a stack of metal interconnect layers adjacent the semiconductor substrate, at least one of the metal interconnect layers being formed by electrodepositing copper;
   annealing, in a deuterium ambient, the at least one metal interconnect layer comprising copper after formation thereof;
   chemical-mechanical polishing (CMP) the at least one metal interconnect layer comprising copper after the annealing thereof.

8. A method according to claim 7 wherein at least one of the stack of metal interconnect layers comprises aluminum.

9. A method according to claim 7 wherein annealing the at least one metal interconnect layer comprises annealing in a temperature range of about 400–450° C.

10. A method according to claim 7 wherein the deuterium ambient comprises a gas including deuterium.

11. A method according to claim 7 further comprising forming an inter-level dielectric layer between each of the metal interconnect layers.

12. A method according to claim 7 wherein the stack of metal interconnect layers includes an uppermost metal interconnect layer; and further comprising forming an overall passivation layer over the uppermost metal interconnect layer.

13. A method for making an integrated circuit comprising the steps of:
   providing a semiconductor substrate;
   forming a stack of metal interconnect layers adjacent the semiconductor substrate, at least one of the metal interconnect layers being formed by electrodepositing copper;
   annealing, in a deuterium ambient, the at least one metal interconnect layer comprising copper after formation thereof; and polishing each metal interconnect layer;

wherein the at least one metal interconnect layer comprising copper is annealed prior to the polishing thereof.

14. A method according to claim 13 wherein at least one of the metal interconnect layers comprises aluminum.

15. A method according to claim 13 wherein annealing the at least one metal interconnect layer comprises annealing in a temperature range of about 400–450° C.

16. A method according to claim 13 wherein the deuterium ambient comprises a gas including deuterium.

17. A method according to claim 13 further comprising forming an inter-level dielectric layer between each of the metal interconnect layers.

18. A method according to claim 13 wherein the stack of metal interconnect layers includes an uppermost metal interconnect layer; and further comprising forming an overall passivation layer over the uppermost metal interconnect layer.

* * * * *